(12) United States Patent  (10) Patent No.: US 8,251,729 B2
Shin et al.  (45) Date of Patent: Aug. 28, 2012

(54) UNIVERSAL FRAME FOR TESTING SEMICONDUCTOR DEVICE

(75) Inventors: Jounghee Shin, Cheonan-si (KR); Sungho Chang, Cheonan-si (KR); Byeongdae Park, Cheonan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/009,076

(22) Filed: Jan. 19, 2011

(65) Prior Publication Data

US 2011/0176864 A1   Jul. 21, 2011

(30) Foreign Application Priority Data

Jan. 20, 2010   (KR) ........................ 10-2010-0005290

(51) Int. Cl.
*H01R 4/50* (2006.01)

(52) U.S. Cl. ...................................... 439/337

(58) Field of Classification Search .............. 439/64, 439/377, 630
See application file for complete search history.

(56) References Cited

U.S. PATENT DOCUMENTS

| 6,102,708 | A  | * | 8/2000 | Kimura ........................... 439/64 |
| 6,386,909 | B1 | * | 5/2002 | Hsia et al. ................. 439/541.5 |
| 7,255,603 | B2 |   | 8/2007 | Kato et al. |
| 2004/0064619 | A1 | | 4/2004 | Liu et al. |
| 2004/0175976 | A1 | | 9/2004 | Park |
| 2005/0037659 | A1 | | 2/2005 | Wu |
| 2008/0207060 | A1 | | 8/2008 | Kiryu et al. |

FOREIGN PATENT DOCUMENTS

| JP | 2005-166377 A | 6/2005 |
| KR | 20-0308174 | 3/2003 |
| KR | 10 2004-0075138 A | 8/2004 |
| KR | 10 2005-0053006 A | 6/2005 |
| KR | 10 2006-0026490 A | 3/2006 |
| KR | 10 2008-0067745 A | 7/2008 |

* cited by examiner

*Primary Examiner* — Phuong Dinh
(74) *Attorney, Agent, or Firm* — Lee & Morse, P.C.

(57) ABSTRACT

A universal frame for connecting a semiconductor device to a test device, the universal frame including a connector for establishing a connection between the semiconductor device and the test device; a head part fixing a position of the connector; a body part fixing a position of the head part, the body part being configured to accommodate the semiconductor device; and a guide unit within the body part, the guide unit being configured to receive the semiconductor device at an end of the body part opposite to an end of the body part fixing the position of head part, and being configured to accommodate the semiconductor device

20 Claims, 11 Drawing Sheets

UNIVERSAL FRAME FOR TESTING SEMICONDUCTOR DEVICE

BACKGROUND

1. Field

Embodiments relates to a universal frame for testing a semiconductor device.

2. Description of the Related Art

Recently, solid state drives (SSDs) have been regarded with much interest as data storage devices for replacing typical hard disk drives (HDDs). Solid state drives are researched and developed based on technologies for non-volatile semiconductor memory storage devices. Such a solid state drive may be connected to a test device through a test gender changer or frame.

SUMMARY

Embodiments are directed to a universal frame for testing a semiconductor device.

At least one of the above and other features and advantages may be realized by providing a universal frame for connecting a semiconductor device to a test device, the universal frame including a connector for establishing a connection between the semiconductor device and the test device; a head part fixing a position of the connector; a body part fixing a position of the head part, the body part being configured to accommodate the semiconductor device; and a guide unit within the body part, the guide unit being configured to receive the semiconductor device at an end of the body part opposite to an end of the body part fixing the position of head part, and being configured to accommodate the semiconductor device.

The guide unit may include a plurality of guide supporters, the plurality of guide supporters having a spacing distance that is adjustable according to a width of the semiconductor device; and a plurality of slide guides respectively supported by the plurality of guide supporters, the plurality of slide guides being configured to closely contact the semiconductor device.

The plurality of slide guides may include a plurality of guide bars, the plurality of guide bars being configured to closely contact sides of the semiconductor device; and a plurality of guide covers covering upper portions of the plurality of guide bars.

The plurality of guide bars may include at least one groove in which the sides of the semiconductor device are insertable.

The plurality of guide bars may be tapered in a direction of insertion of the semiconductor device.

The plurality of guide supporters may include a plurality of angle plates respectively supporting the plurality of slide guides; and a plurality of springs providing an elastic force to the plurality of slide guides supported by the plurality of angle plates.

The plurality of angle plates may include a plurality second holes configured to confine movement of the plurality of slide guides.

The plurality of guide supporters may further include at least one variable fixation shaft configured to fix a position of the plurality of angle plates.

The variable fixation shaft may include a bolt and a nut.

The plurality of guide supporters may further include second fixation pins at ends of the plurality of angle plates, the second fixation pins being coupled to the head part.

The connector may include a first connector connectable to a port of the semiconductor device, and a second connector connected to the first connector and being connectable with a port of the test device.

The connector may further include a plurality of screws fixing the first connector or the second connector to the head part.

The first connector may be connected to the second connector by wire bonding or soldering.

The connector may include at least one of a socket connector, a printed circuit board (PCB) connector, and a combination-type connector.

The head part may include a head frame within the body part; a plurality of head buckles fixing the head frame to the body part; and a first fixation pin fixing the head frame to the guide unit.

The body part may include a body frame housing the head part and the guide unit; and a plurality of body buckles engaged with the head buckles.

The body frame may include a first hole configured to confine a movement of the guide unit.

At least one of the above and other features and advantages may also be realized by providing a universal frame for connecting a semiconductor device to a test device, the universal frame including a connector for establishing a connection between the semiconductor device and the test device; a head part fixing a position of the connector; a body part fixing a position of the head part, the body part being configured to accommodate the semiconductor device; a guide unit within the body part; and a dummy mold configured to carry the semiconductor device within the guide unit.

The dummy mold may include a mold frame configured to surround the semiconductor device.

The dummy mold may further include a support part configured to support the semiconductor device.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2010-0005290, filed on Jan. 20, 2010, in the Korean Intellectual Property Office, and entitled: "Gender Changer for Testing Semiconductor Device", is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another element, it can be directly on the other element, or intervening elements may also be present. In addition, it will also be understood that when an element is referred to as being "between" two elements, it can be the only element between the two elements, or one or more intervening elements may also be present. Like reference numerals refer to like elements throughout.

Also, though terms like a first and a second are used to describe various holes and pins in various embodiments, the holes and the pins are not limited to these terms. These terms are used only to discriminate one hole or pin from another hole or pin. An embodiment described and exemplified herein includes a complementary embodiment thereof.

Figure 1:
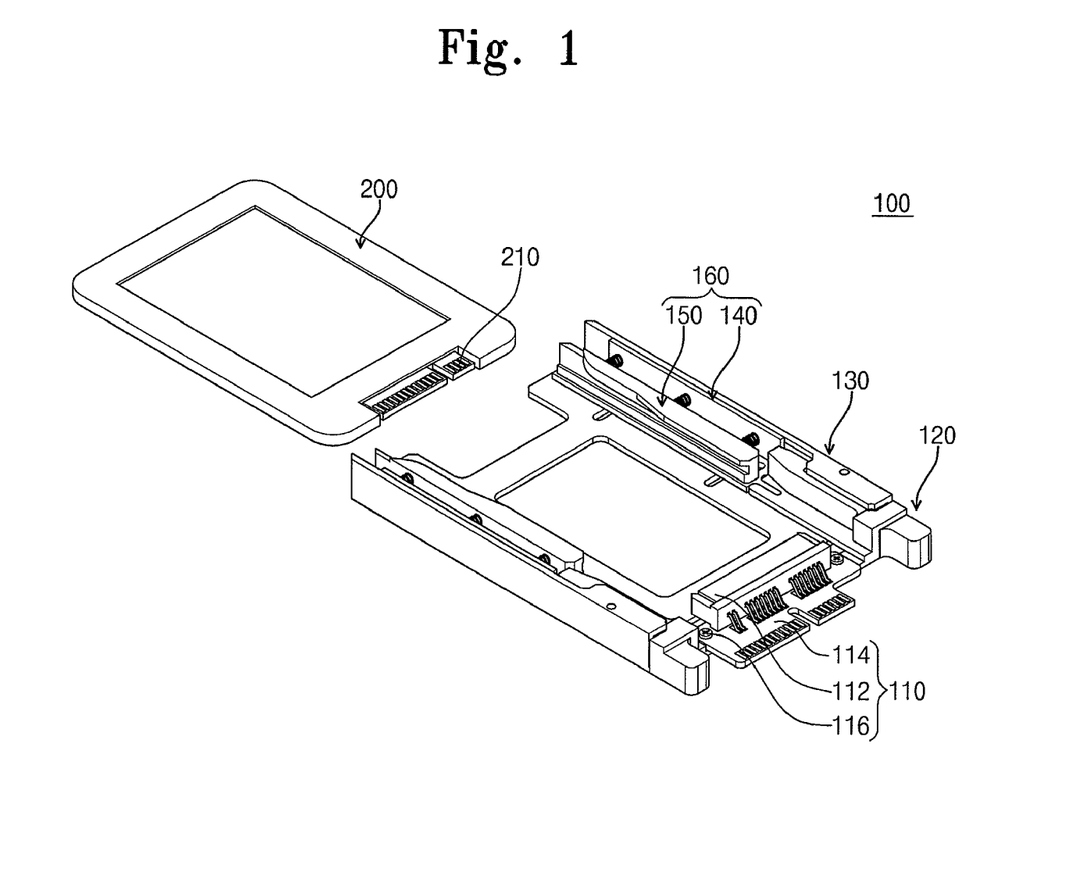
FIG. 1 illustrates a perspective view of a universal frame for testing a semiconductor device according to an embodiment.
Figure 2:
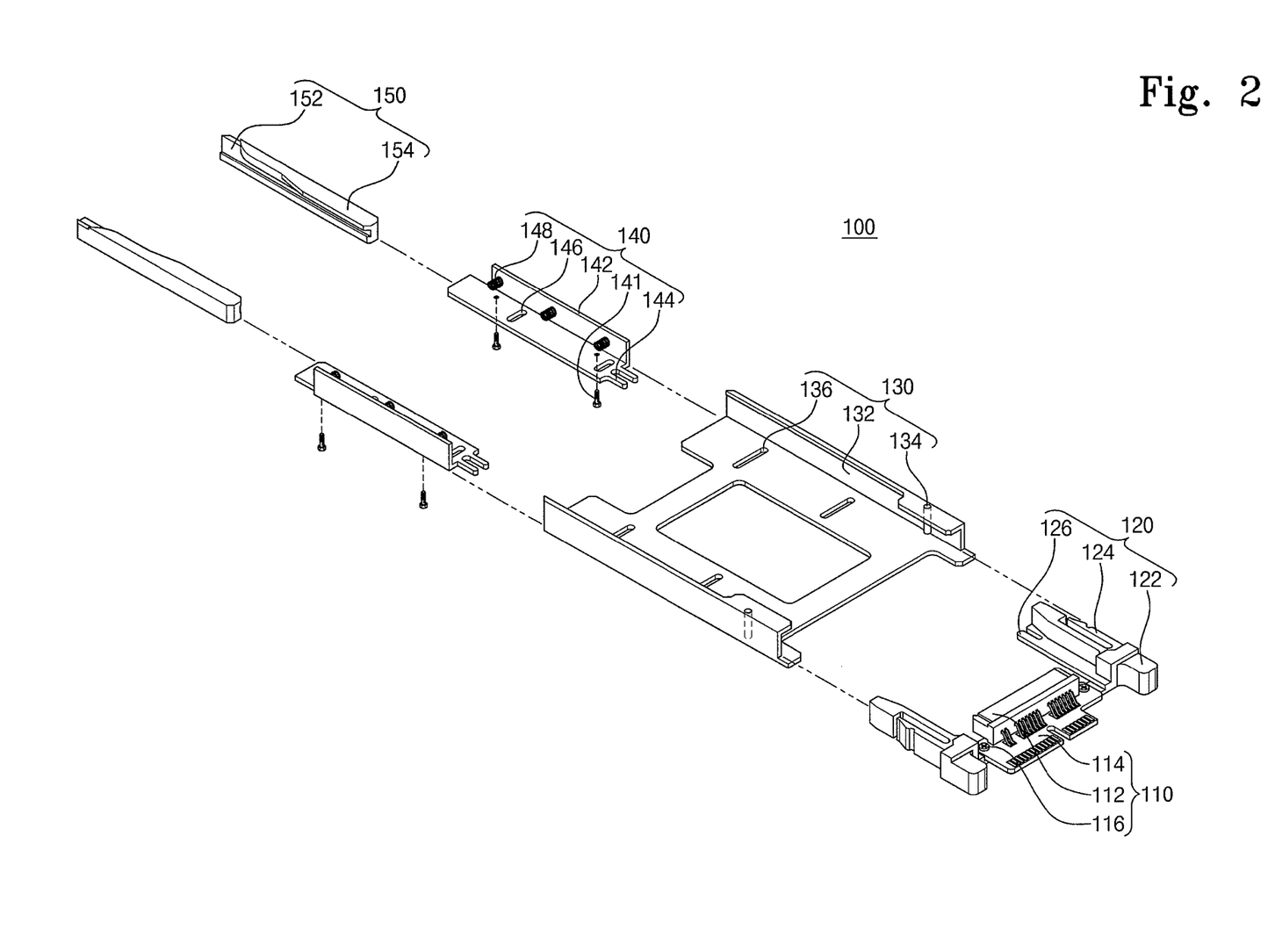
FIG. 2 illustrates an exploded perspective view of the universal frame of FIG. 1.

FIG. 1 illustrates a perspective view of a universal frame for connecting a semiconductor device to a test device, according to an embodiment. FIG. 2 illustrates an exploded perspective view of the universal frame of FIG. 1.

Referring to FIGS. 1 and 2, in a universal frame 100 for testing a semiconductor device a connector 110 may be fixed to a head part 120 at a side of a body part 130, and a solid state drive 200 may be inserted into a guide unit 160 at another side of the body part 130. The connector 110 may be connected to the solid state drive 200 when the solid state drive 200 is accommodated in the universal frame 100, e.g., within the body part 130. The size of the solid state drive 200 accommodated by the universal frame 100, e.g., the guide unit 160 may be varied. For example, the guide unit 160 may include a plurality of guide supporters 140 having a spacing distance that is adjustable according to a width of the solid state drive 200, and a plurality of slide guides 150 supported by the plurality of guide supporters 140 to closely contact sides of the solid state drive 200.

Thus, the universal frame 100 according to the present embodiment may accommodate a solid states drive 200 having an arbitrary size or various sizes.

The solid state drive 200 may have a rectangular thin plane shape. The solid state drive 200 may include a port 210 at an edge thereof, the port 210 being connectable to the connector 110. The port 210 may be disposed at a forward or front face of the solid state drive 200. The solid state drive 200 may be inserted between the plurality of slide guides 150 by first inserting the forward or front face.

The connector 110 may connect the solid state drive 200 to a test device (not illustrated). For example, the connector 110 may connect the port 210 of the solid state drive 200 to a port (not illustrated) of the test device. The connector 110 may include a first connector 112 that is connectable to the port 210 of the solid state drive 200 and a second connector 114 connected to the first connector 112 and connectable to the port of the test device. The first connector 112 may be connected with the second connector 114 through wire bonding or soldering. For example, the connector 110 may include at least one of a socket connector, a printed circuit board (PCB) connector, and a combination-type connector. The connector 110 may be fixed to the head part 120 by, e.g., screws 116.

The head part 120 may include a head frame 122 within the body part 130, a plurality of head buckles 124 for fixing the head frame 122 to the body part 130, and first fixation pins 126 for fixing the head frame 122 to the plurality of guide supporters 140. The head frame 122 may be partially inserted in the body part 130. The head frame 122 may fix the connector 110 in position. The head frame 122 may surround the forward or front face of the solid state drive 200 at sides of the body part 130 when the solid state drive 200 is accommodated in the universal frame 100. The head buckles 124 may fix the head frame 122 in position within the body part 130. The first fixation pins 126 may be coupled with the plurality of guide supporters 140 inserted in the body part 130.

The body part 130 may include a body frame 132 for receiving the head part 120 and the guide unit 160, and body buckles 134 engaging with the head buckles 124 of the head part 120. The body frame 132 may function as a housing that surrounds the head part 120 and the guide unit 160. For example, the body frame 132 may include a horizontal surface parallel to the ground or a surface on which the universal frame is placed. The body frame 132 may be open at ends thereof, e.g., at an end including the head part 120 and at and end in which the solid state drive 200 is inserted. Furthermore, the body frame 132 may be open to an upper side thereof, e.g., an upper side of the solid state drive 200 when the solid state drive 200 is accommodated therein. Thus, the solid state drive 200 may be inserted into or drawn out at an end opposite to the end including the head part 120. The body frame 132 may support sides of the solid state drive 200. The body buckles 134 may include buckle pins. The body frame 132 may include first holes 136 for confining movements of the plurality of guide supporters 140. The first holes 136 may determine movement directions and movement distances of the plurality of guide supporters 140.

The plurality of guide supporters 140 may include a plurality of angle plates 142, e.g., angle irons or angle bars, configured to respectively support the plurality of slide guides 150. The plurality of guide supporters 140 may also include second fixation pins 144 coupled to the first fixation pins 126 of the head part 120 as well as a plurality of springs 148 that provide a predetermined elastic force to the plurality of slide guides 150. The plurality of angle plates 142 may support lower portions of sides of the solid state drive 200 and lower portions of the plurality of slide guides 150 when the solid state drive 200 is accommodated in the universal frame 100. In addition, the plurality of angle plates 142 may support sides of the solid state drive 200 and sides of the plurality of slide guides 150. The plurality of angle plates 142 may include second holes 146 for confining movement of the plurality of slide guides 150. The second holes 146 may determine movement directions and movement distances of the plurality of slide guides 150. The second fixation pins 144 may engage with the first fixation pins 126 of the head part 120. The plurality of guide supporters 140 and the head part 120 may be fixed to each other through the second fixation pins 144 and the first fixation pins 126. For example, the first fixation pins 126 and the second fixation pins 144 may include saw tooth-shaped clamps engaging with each other.

The plurality of guide supporters 140 may include variable fixation shafts 141 in the first holes 136 and may be configured to adjust a distance between the plurality of angle plates 142 facing each other on the body frame 132. For example, the variable fixation shafts 141 may include bolts and nuts. A distance between the plurality of angle plates 142 may be varied according to a width of the solid state drive 200. Thus, the universal frame 100 according to the present embodiment may accommodate the solid state drive 200 having an arbitrary size within the body part 130 while the connector 110 maintains a fixed position.

When the solid state drive 200 is accommodated in the universal frame 100, the plurality of slide guides 150 may closely contact sides of the solid state drive 200. For example, the solid state drive 200 may be inserted into the universal frame 100 at an end opposite to the end including the head part 120. The plurality of slide guides 150 may be tapered along an insertion direction of the solid state drive 200. For example, the plurality of slide guides 150 may include a plurality of guide bars 152 closely contacting both sides of the solid state drive 200, a plurality of guide covers 154 at upper sides of the plurality of guide bars 152, and at least one movement shaft (not illustrated) in the second holes 146. Thus, a distance between the plurality of guide bars 152 may be adjusted by the movement shaft along the second holes 146. The plurality of guide bars 152 may include at least one groove extending along the insertion direction of the solid state drive 200. The groove may have a multi-step shape to accommodate the solid state drive 200 having an arbitrary thickness or other dimension. The plurality of guide bars 152 may have a thickness greater than a maximum thickness of the solid state drive 200. The plurality of guide covers 154 may cover sides of the solid state drive 200. The plurality of guide covers 154 may prevent the sides of the solid state drive 200 from losing contact with the plurality of guide bars 152. The plurality of guide bars 152 may be integrally formed with the plurality of guide covers 154.

Figure 3:
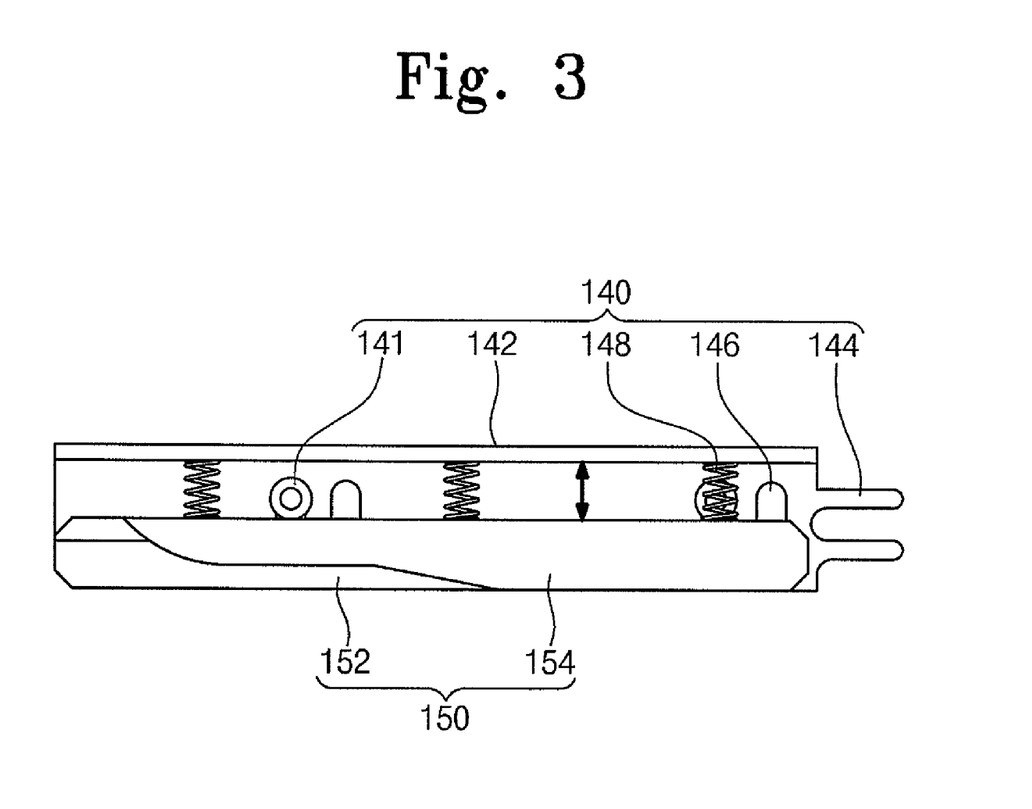
FIG. 3 illustrates a plan view of a guide unit of the universal frame of FIG. 1.

FIG. 3 illustrates a plan view of the guide unit 160. The plurality of slide guides 150 may reciprocate in directions represented by arrows on the plurality of angle plates 142. The plurality of slide guides 150 may move on the plurality of angle plates 142 in the arrow directions by a distance corresponding to a size of the second holes 146. When the solid state drive 200 is accommodated in the universal frame 100, the springs 148 may provide elastic force so that the plurality of slide guides 150 may closely contact the solid state drive 200. The plurality of slide guides 150 may compress the springs 148 when the solid state drive 200 is accommodated in the universal frame 100, e.g., inserted within the body part 130. The plurality of slide guides 150 may facilitate expansion of the springs 148 when the solid state drive 200 is removed from the universal frame 100, e.g., the body part 130. Thus, when the solid state drive 200 is accommodated in the universal frame 100, the plurality of slide guides 150 may fix a position of the solid state drive 200 by the elastic force of the springs 148.

Figure 4:
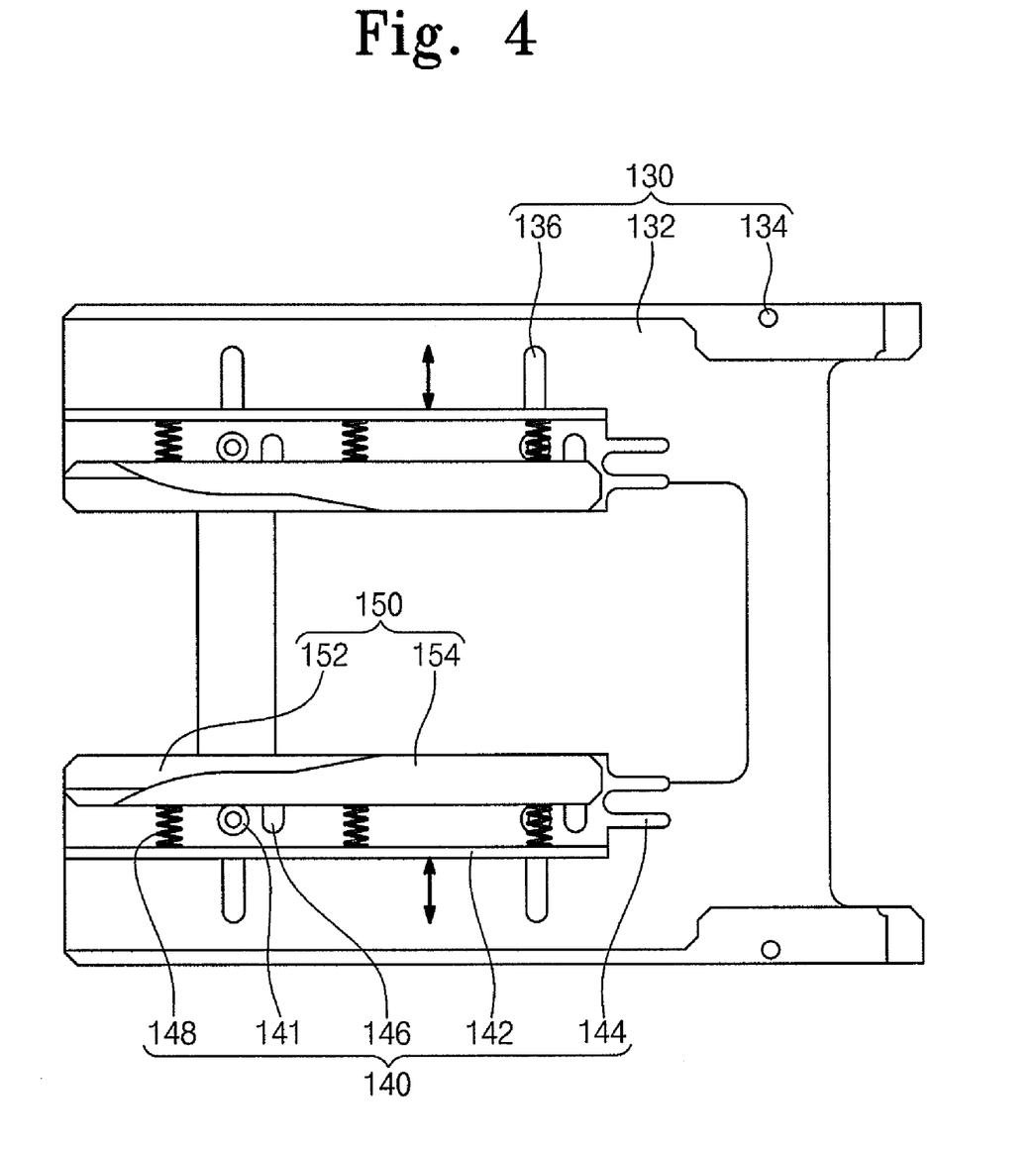
FIG. 4 illustrates a plan view of a guide unit coupled to a body part of the universal frame of FIG. 1.

FIG. 4 illustrates a plan view of the body part 130 and the guide unit 160. A distance between the plurality of guide supporters 140 may be adjustable according to the width of the solid state drive 200 to be inserted in the plurality of slide guides 150. The plurality of guide supporters 140 may be moved away from or closer to each other depending on the width of the solid state drive 200 to be accommodated in the universal frame 100. The plurality of guide supporters 140 may move on the body frame 132 along the first holes 136. When the width of the solid state drive 200 is determined, the plurality of guide supporters 140 may be fixed to the body frame 132 by the variable fixation shafts 141. For example, the plurality of guide supporters 140 may be fixed to the body frame 132 by the variable fixation shafts 141 when the solid state drive 200 is inserted in an entrance of the plurality of guide bars 152.

Thus, the universal frame 100 according to the present embodiment may include the plurality of guide supporters 140 that are adjustable depending on the distance between sides of the solid state drive 200 having an arbitrary size.

Figure 5A:
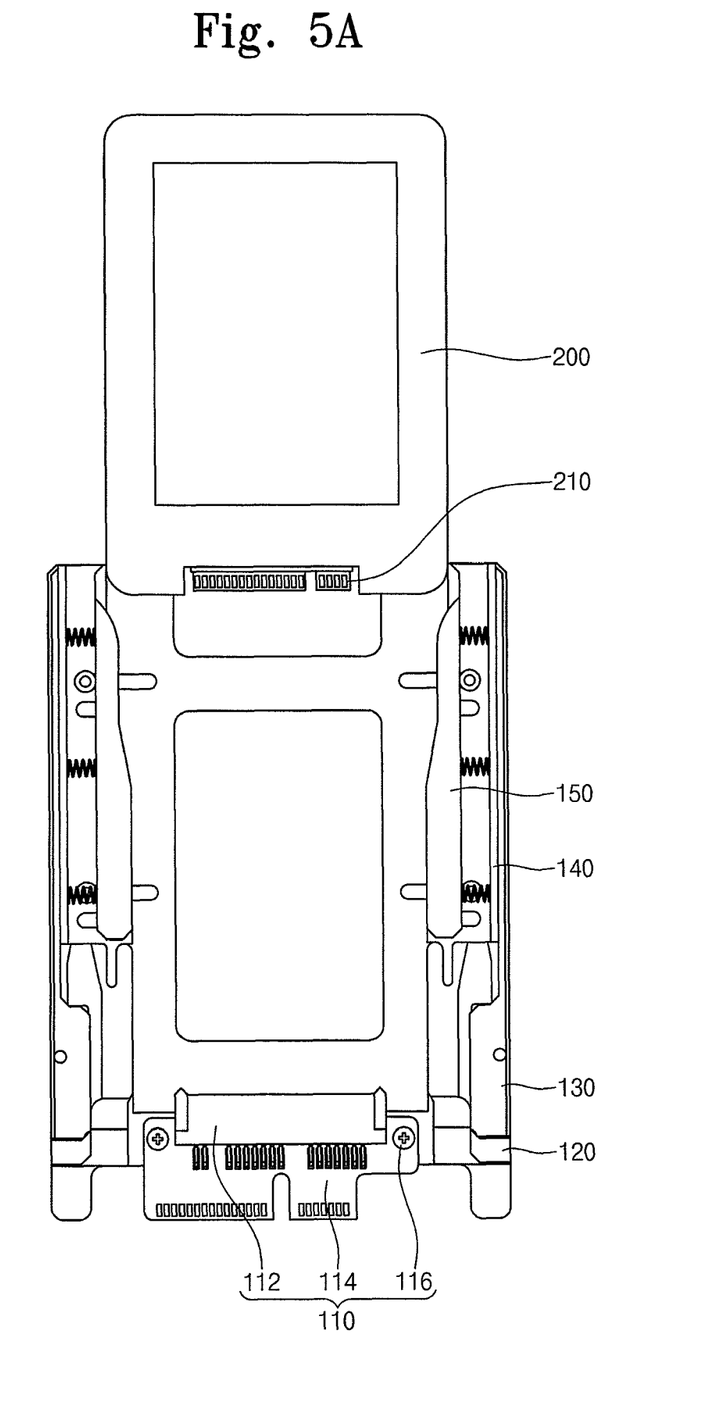
FIGS. 5A through 5C illustrate plan views sequentially showing coupling of a solid state drive with the universal frame of FIG. 1.
Figure 5B:
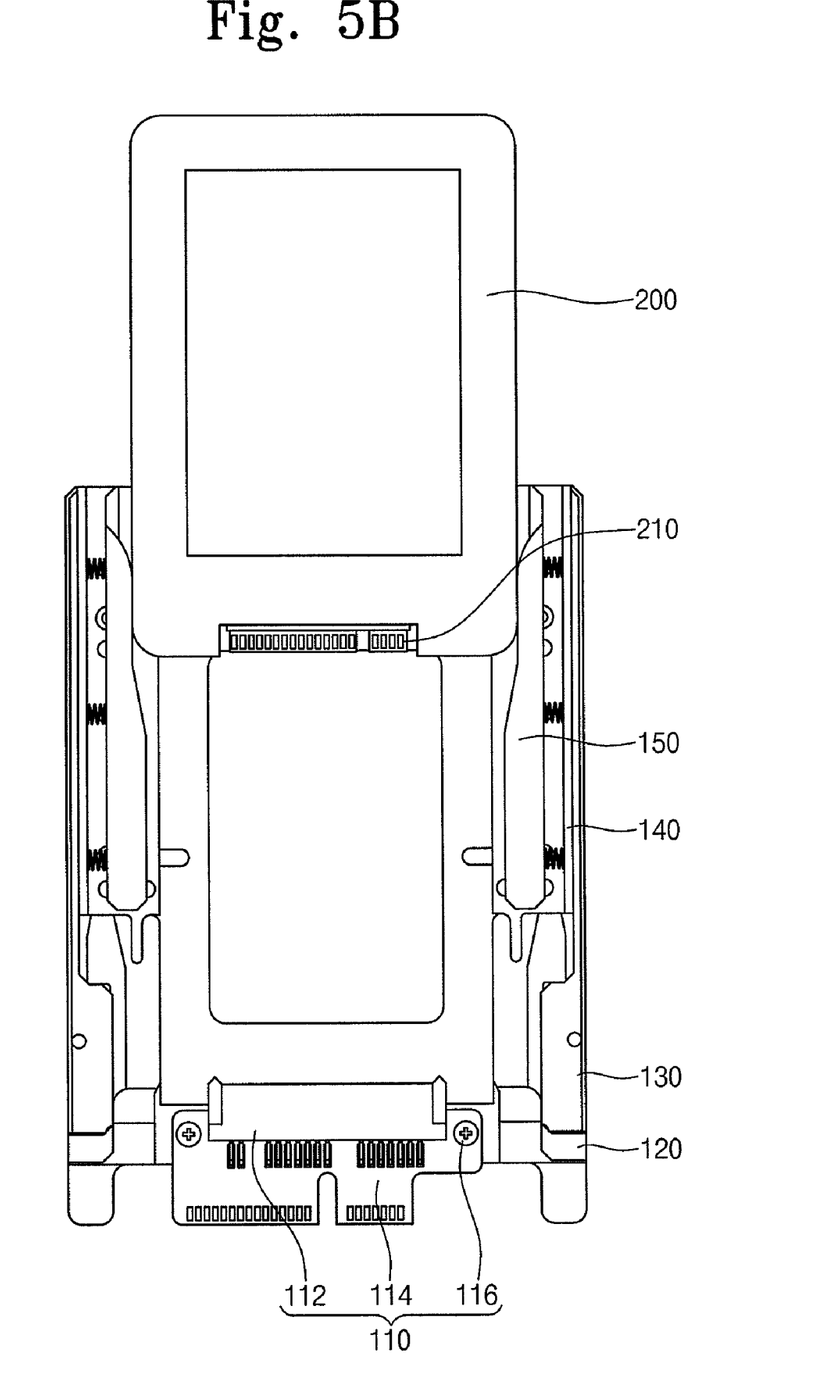
Figure 5C:
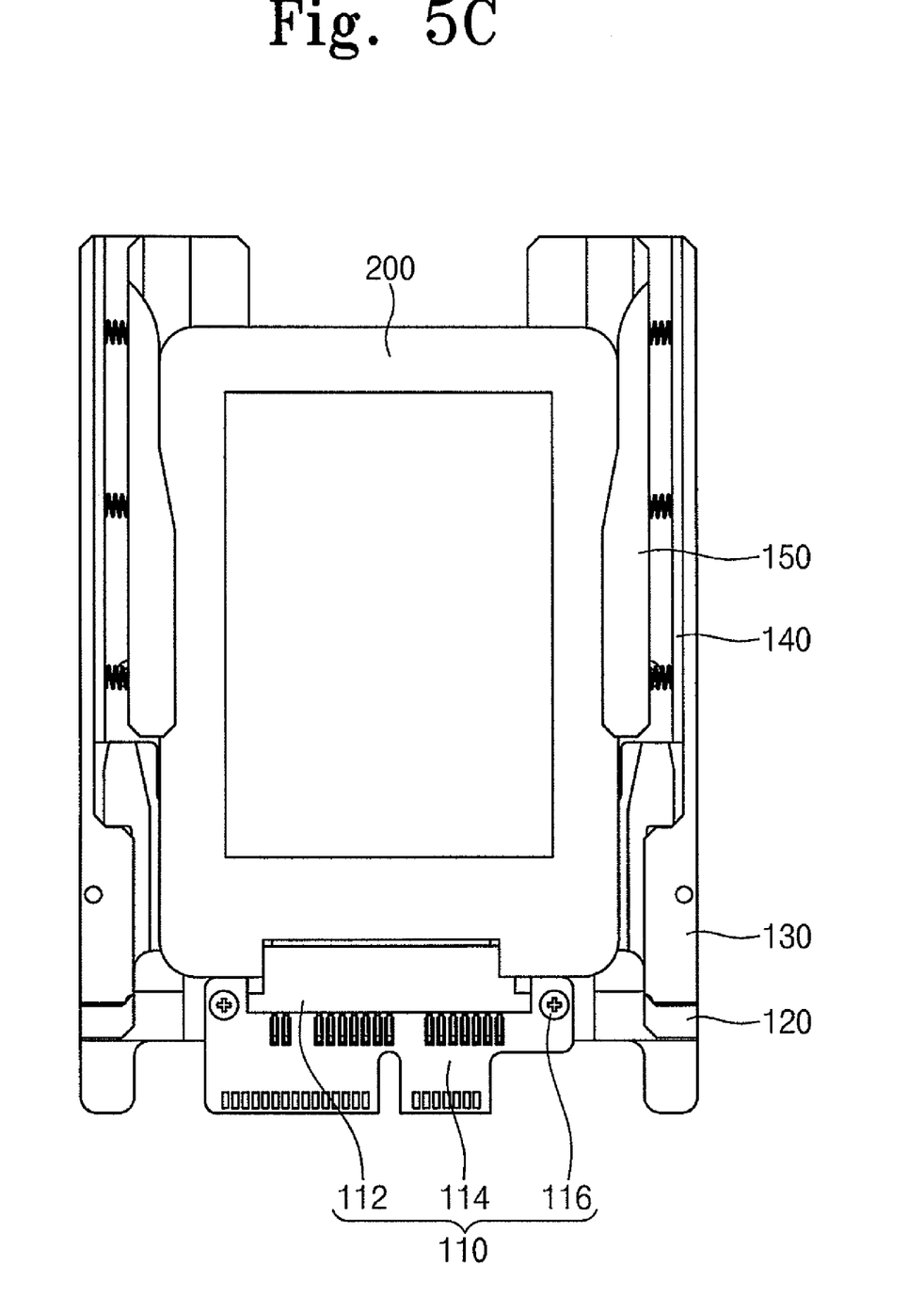

FIGS. 5A through 5C illustrate plan views sequentially showing coupling of the solid state drive 200 with the universal frame 100 for testing a semiconductor device. The plurality of slide guides 150 may be pushed to edges of the body part 130 when the solid state drive 200 is inserted into the body frame 132. As going away from each other, the plurality of slide guides 150 may hold the sides of the solid state drive 200. The springs 148 may bring the plurality of slide guides 150 into close contact with the solid state drive 200. Operations of the plurality of slide guides 150 during the insertion of the solid state drive 200 will now be described.

First, when the insertion of the solid state drive 200 is started, the plurality of slide guides 150 may not move. At this time, a distance between the plurality of slide guides 150 may be less than the width of the solid state drive 200, and the plurality of slide guides 150 may be parallel to each other. The solid state drive 200 may overlap the entrance of the tapered portions of the plurality of guide bars 152. The solid state drive 200 may be horizontally inserted between the plurality of slide guides 150.

Next, when the solid state drive 200 passes through the tapered portion, the plurality of slide guides 150 may move away from each other starting from the entrance. Thus, the plurality of slide guides 150 may no longer be parallel to each other, so that the solid state drive 200 may be inserted between the plurality of slide guides 150. The plurality of slide guides 150 may closely contact the solid state drive 200 at sides thereof. Thus, the solid state drive 200 may be inserted toward the connector 110 in a state where the solid state drive 200 is confined by the plurality of slide guides 150.

The plurality of slide guides 150 may maximally move away from each other until the port 210 of the solid state drive 200 is connected to the first connector 112. The plurality of slide guides 150 may be horizontally disposed at sides of the solid state drive 200. The plurality of slide guides 150 may fix the position of the solid state drive 200 coupled to the connector 110. The solid state drive 200 may undergo a test in the state where the position of the solid state drive 200 is fixed by the plurality of slide guides 150. After the test, the solid state drive 200 may be removed from the plurality of slide guides 150 in the reverse sequence to the insertion sequence.

The solid state drive 200 may include, e.g., a commercialized semiconductor device, and the port 210 may have a predetermined size or less. The test device, which may include test equipment configured to perform an electrical test for the solid state drive 200, may have an arbitrary port size. Thus, the port 210 of the solid state drive 200 may be smaller than the port of the test device. Accordingly, the first connector 112 may be smaller than the second connector 114.

Figure 6A:
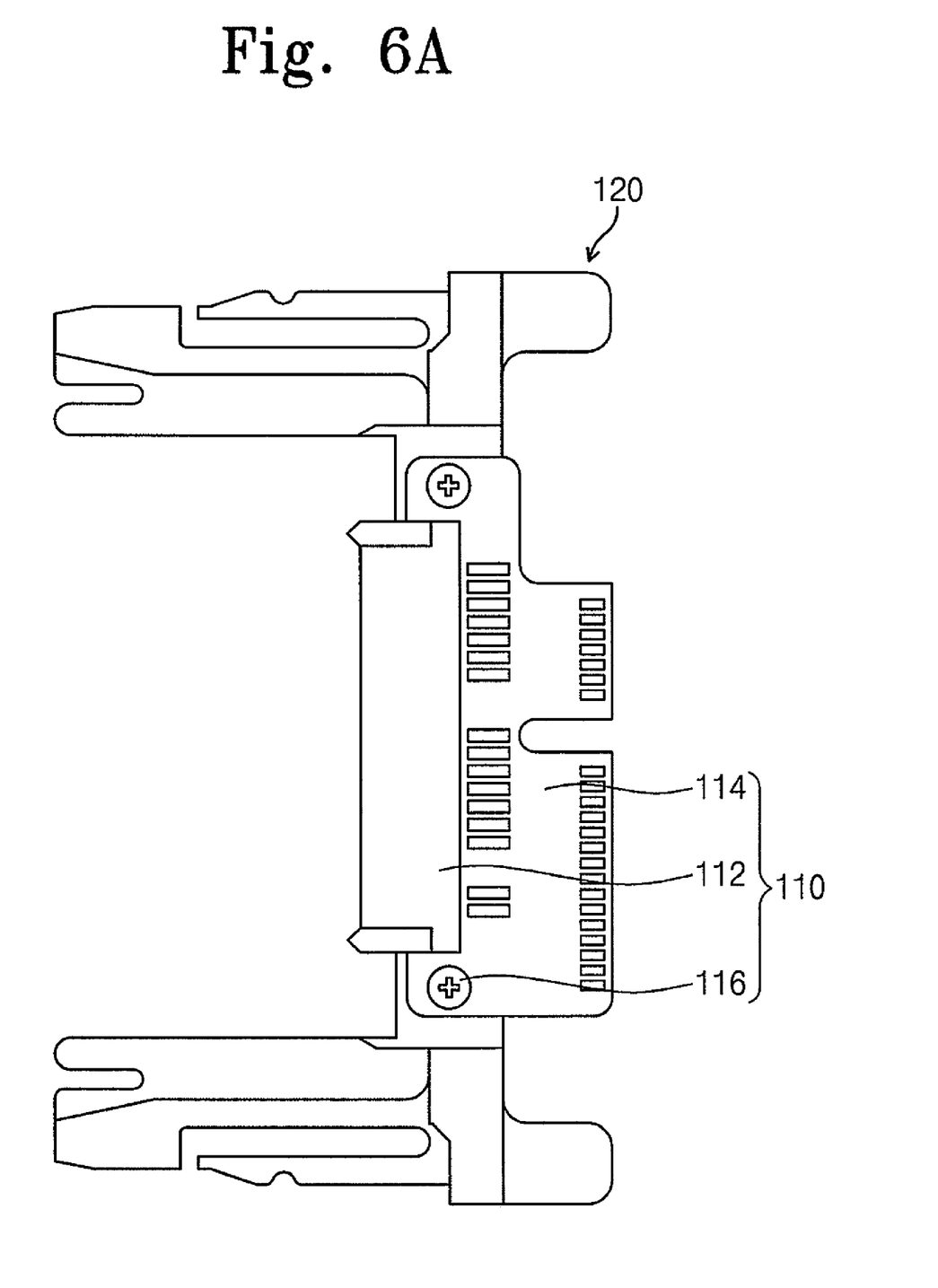
FIGS. 6A through 6C illustrate plan views of various types of connectors fixed to a head part of the universal frame according to an embodiment.
Figure 6B:
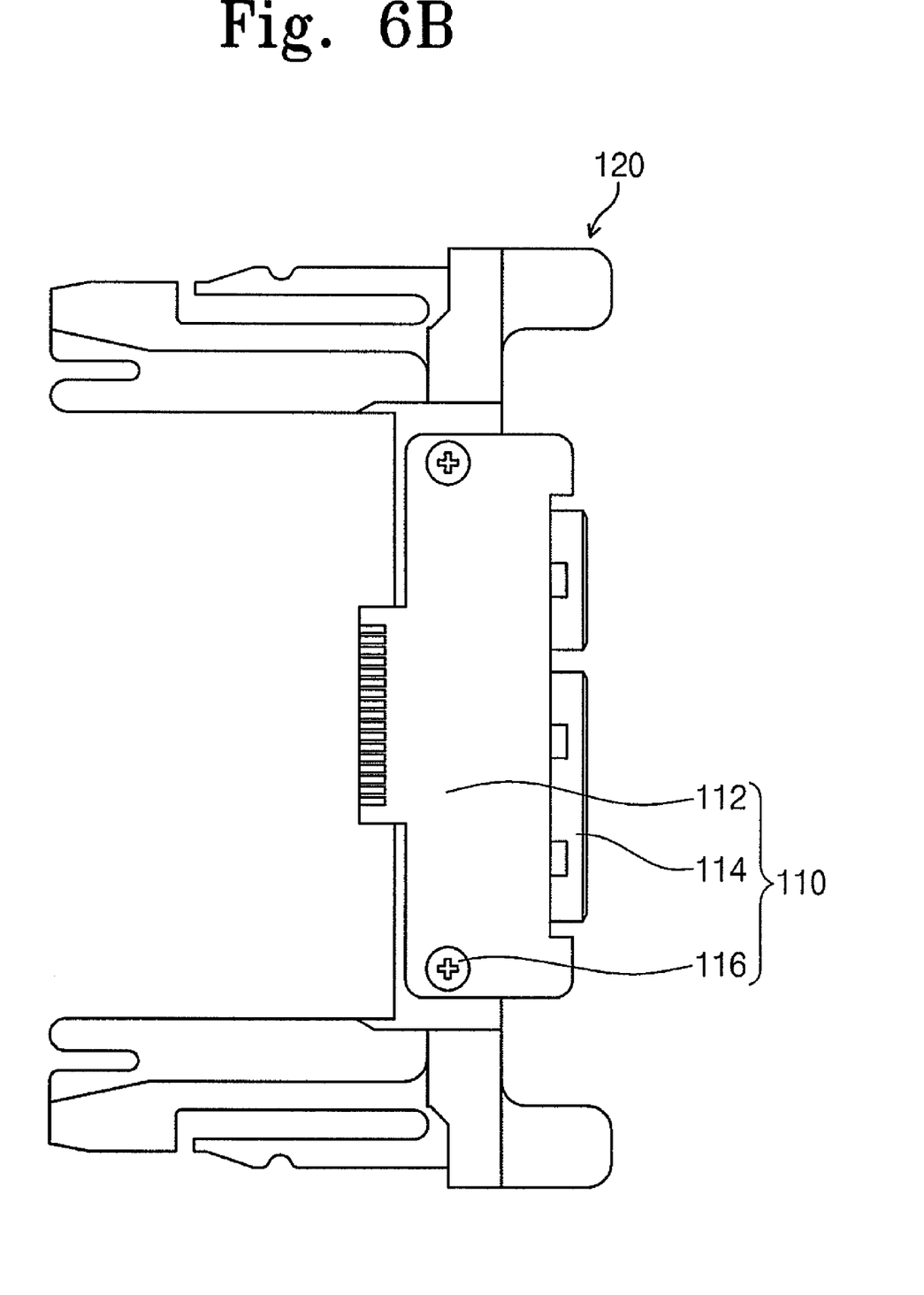
Figure 6C:
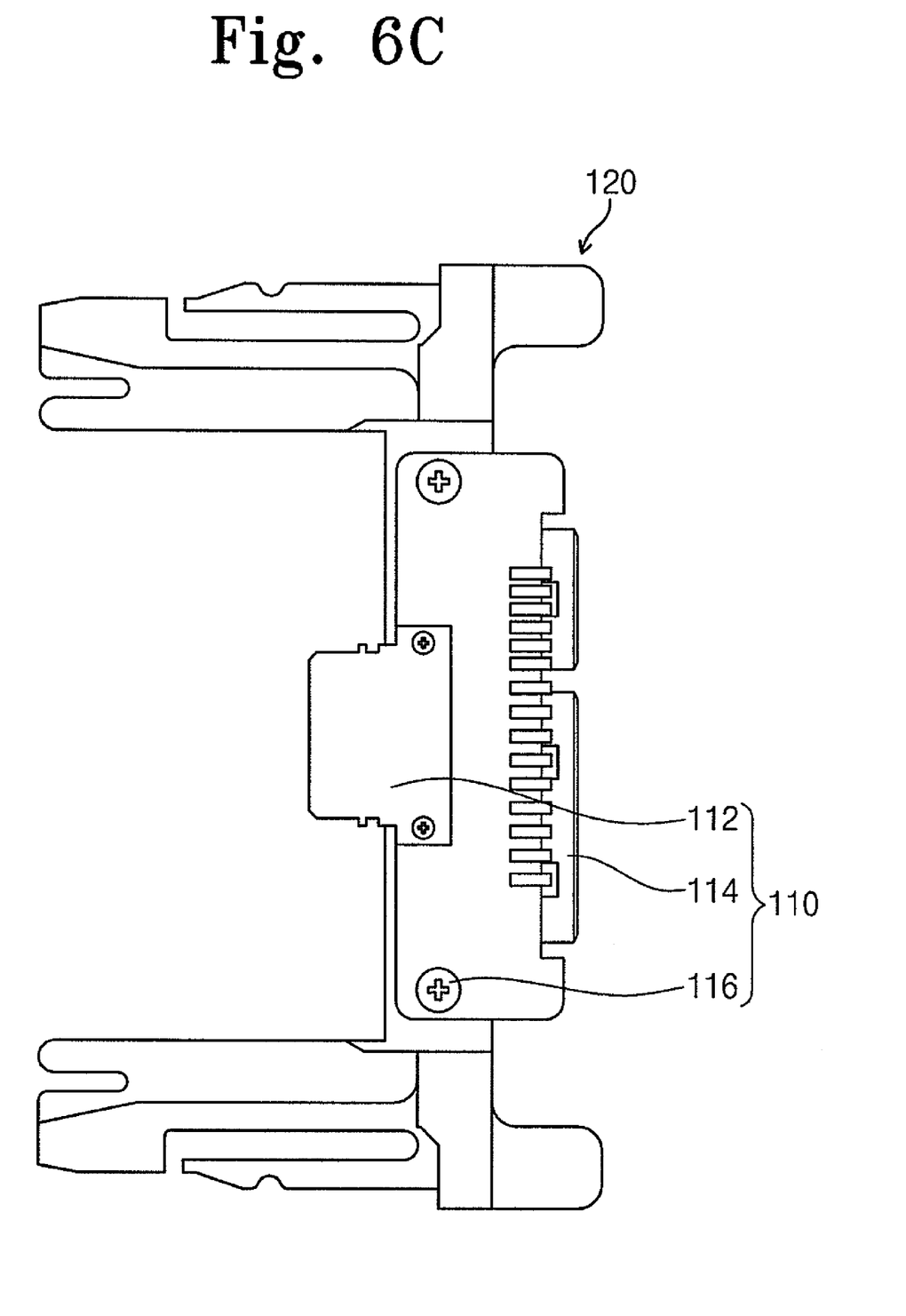

FIGS. 6A through 6C illustrate plan views showing various types of connectors fixed to the head part 120.

Referring to FIG. 6A, the second connector 114 may fix the position of and may be connected to the first connector 112 and may be fixed to the head part 120 by the screws 116. The second connector 114 may include a PCB connector; and the first connector 112 may include a socket connector. The port 210 of the solid state drive 200 may be connected to the first connector 112. The port 210 may include a PCB port. The port of the test device may be connected to the second connector 114 and may include a socket port.

Referring to FIG. 6B, the first connector 112 may fix the position of and may be connected to the second connector 114 and may be fixed to the head part 120 by the screws 116. The first connector 112 may include a PCB connector; and the second connector 114 may include a socket connector. The solid state drive 200 connected to the first connector 112 may include a socket port. A portion of the first connector 112 inserted into the socket port of the solid state drive 200 may be smaller than the second connector 114.

Referring to FIG. 6C, the first connector 112 and the second connector 114 may be respectively and discretely fixed to the head part 120 by the screws 116. The first connector 112 may include a socket connector; and the second connector 114 may include a combination-type connector including, e.g., a PCB connector and a socket connector.

Although not illustrated, both the first connector 112 and the second connector 114 may include PCB connectors. In an implementation, both the first connector 112 and the second connector 114 may include socket connectors. One of the first connector 112 and the second connector 114, which may fix the position of the other, may be fixed to the head part 120 by the screws 116. The first connector 112 and the second connector 114 may be respectively and discretely fixed to the head part 120.

Thus, the universal frame 100 may include an arbitrary type of connector 110 for connecting to the solid state drive 200 accommodated in the universal frame 100, e.g., fixed to the guide unit 160.

Figure 7:
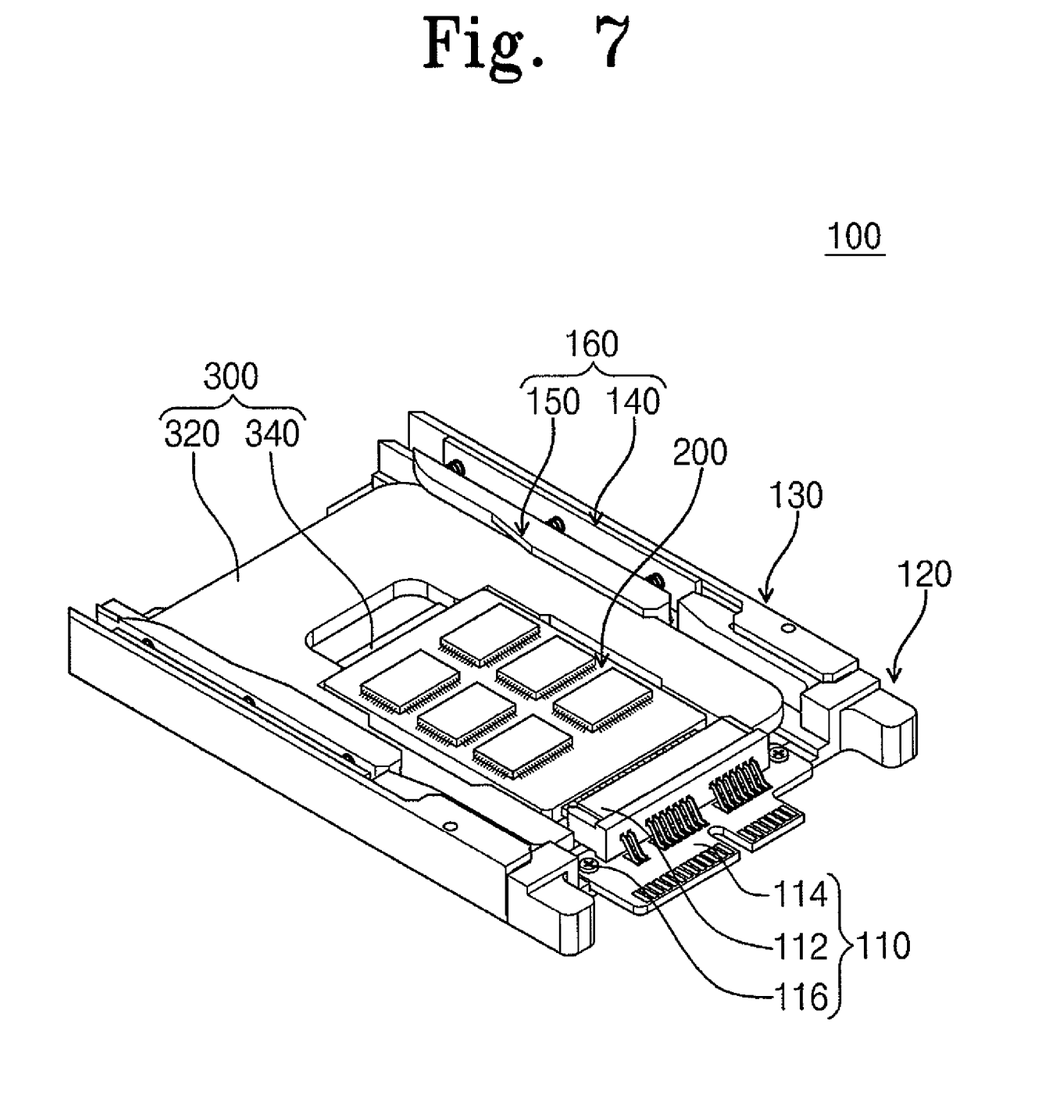
FIG. 7 illustrates a perspective view of a universal frame for testing a semiconductor device according to another embodiment.

FIG. 7 illustrates a perspective view of a universal frame 100 for testing a semiconductor device according to another embodiment.

Referring to FIG. 7, the universal frame 100 according to the present embodiment may include a dummy mold 300 inserted into the guide unit 160 to accommodate a solid state drive 200 that is relatively small. The dummy mold 300 may carry the solid state drive 200 into the guide unit 160. The dummy mold 300 may be accommodated and fixed within the body part 130 by the guide unit 160.

For example, the dummy mold 300 may include a mold frame 320 configured to surround sides of the solid state drive 200 except for a port 210 thereof, and a support part 340 configured to support the solid state drive 200 in the mold frame 320. The support part 340 may support at least one portion of a lower part of the solid state drive 200 housed or accommodated in the mold frame 320. The dummy mold 300 may be inserted into the guide unit 160 at an end of the universal frame 100 the position of to the end thereof including the head part 120. In addition, after being fixed to the head part 120, the dummy mold 300 may be inserted to one side of the body part 130 along a straight line.

Thus, in the universal frame 100 according to the present embodiment, a relatively small solid state drive 200 that may not otherwise be accommodated in the universal frame 100, e.g., fixed to the guide unit 160, may be coupled to, e.g., housed or accommodated in, the dummy mold 300, so that the solid state drive 200 may then be accommodated in the universal frame 100, e.g., fixed to the guide unit 160.

By way of review, since typical test gender changers or frames may be differently fabricated according to different sizes of solid state drives, productivity may be decreased. And yet, apart from the gender changer or frame, the test device itself would not inherently be restricted to measurement of only one size or shape of solid state drive or device According to the embodiments, a solid state drive having an arbitrary size and a connector within a universal frame may be connected to a test device, thus increasing or maximizing productivity.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A universal frame for connecting a semiconductor device to a test device, the universal frame comprising:
   a connector for establishing a connection between the semiconductor device and the test device;
   a head part fixing a position of the connector;
   a body part fixing a position of the head part, the body part being configured to accommodate the semiconductor device; and
   a guide unit within the body part, the guide unit:
      being configured to receive the semiconductor device at an end of the body part opposite to an end of the body part fixing the position of head part, and
      being configured to accommodate the semiconductor device,
   wherein the guide unit includes:
   a plurality of guide supporters, the plurality of guide supporters having a spacing distance that is adjustable according to a width of the semiconductor device; and
   a plurality of slide guides respectively supported by the plurality of guide supporters, the plurality of slide guides being configured to closely contact the semiconductor device.

2. The universal frame as claimed in claim 1, wherein the plurality of slide guides include:
   a plurality of guide bars, the plurality of guide bars being configured to closely contact sides of the semiconductor device; and
   a plurality of guide covers covering upper portions of the plurality of guide bars.

3. The universal frame as claimed in claim 2, wherein the plurality of guide bars include at least one groove in which the sides of the semiconductor device are insertable.

4. The universal frame as claimed in claim 2, wherein the plurality of guide bars are tapered in a direction of insertion of the semiconductor device.

5. The universal frame as claimed in claim 1, wherein the plurality of guide supporters include:
   a plurality of angle plates respectively supporting the plurality of slide guides; and
   a plurality of springs providing an elastic force to the plurality of slide guides supported by the plurality of angle plates.

6. The universal frame as claimed in claim 5, wherein the plurality of angle plates include a plurality second holes configured to confine movement of the plurality of slide guides.

7. The universal frame as claimed in claim 5, wherein the plurality of guide supporters further include at least one variable fixation shaft configured to fix a position of the plurality of angle plates.

8. The universal frame as claimed in claim 7, wherein the variable fixation shaft includes a bolt and a nut.

9. The universal frame as claimed in claim 5, wherein the plurality of guide supporters further include second fixation pins at ends of the plurality of angle plates, the second fixation pins being coupled to the head part.

10. The universal frame as claimed in claim 1, wherein the connector includes:
    a first connector connectable to a port of the semiconductor device, and
    a second connector connected to the first connector and being connectable with a port of the test device.

11. The universal frame as claimed in claim 10, wherein the connector further includes a plurality of screws fixing the first connector or the second connector to the head part.

12. The universal frame as claimed in claim 10, wherein the first connector is connected to the second connector by wire bonding or soldering.

13. The universal frame as claimed in claim 10, wherein the connector includes at least one of a socket connector, a printed circuit board (PCB) connector, and a combination-type connector.

14. The universal frame as claimed in claim 1, wherein the head part includes:
   a head frame within the body part;
   a plurality of head buckles fixing the head frame to the body part; and
   a first fixation pin fixing the head frame to the guide unit.

15. The universal frame as claimed in claim 14, wherein the body part includes:
   a body frame housing the head part and the guide unit; and
   a plurality of body buckles engaged with the head buckles.

16. The universal frame as claimed in claim 15, wherein the body frame includes a first hole configured to confine a movement of the guide unit.

17. A universal frame for connecting a semiconductor device to a test device, the universal frame comprising:
   a connector for establishing a connection between the semiconductor device and the test device;
   a head part fixing a position of the connector;
   a body part fixing a position of the head part, the body part being configured to accommodate the semiconductor device; and
   a guide unit within the body part, the guide unit:
      being configured to receive the semiconductor device at an end of the body part opposite to an end of the body part fixing the position of head part, and
      being configured to accommodate the semiconductor device,
   wherein the head part includes:
      a head frame within the body part;
      a plurality of head buckles fixing the head frame to the body part; and
      a first fixation pin fixing the head frame to the guide unit.

18. The universal frame as claimed in claim 17, further comprising a dummy mold configured to carry the semiconductor device within the guide unit.

19. The universal frame as claimed in claim 18, wherein the dummy mold includes a mold frame configured to surround the semiconductor device.

20. The universal frame as claimed in claim 19, wherein the dummy mold further includes a support part configured to support the semiconductor device.

* * * * *